US011646148B2

(12) United States Patent
Salz et al.

(10) Patent No.: US 11,646,148 B2
(45) Date of Patent: May 9, 2023

(54) PASSIVE ELECTRICAL COMPONENT WITH COATING TO IMPROVE THE LOADING CAPACITY

(71) Applicant: Fraunhofer-Gesellschaft zur Förderung der angewandten Forschung e.V., Munich (DE)

(72) Inventors: Dirk Salz, Bremen (DE); Ralph Wilken, Rastede (DE); Stefan Dieckhoff, Lilienthal (DE); Malte Burchardt, Bremen (DE); Christopher Dölle, Delmenhorst (DE); Christoph Regula, Bremen (DE); Franz-Josef Wöstmann, Münster (DE)

(73) Assignee: Fraunhofer-Gesellschaft zur Förderung dee angewandten Forschung e.V., Munich (DE)

( * ) Notice: Subject to any disclaimer, the term of this patent is extended or adjusted under 35 U.S.C. 154(b) by 1115 days.

(21) Appl. No.: 16/322,838

(22) PCT Filed: Aug. 4, 2017

(86) PCT No.: PCT/EP2017/069782
§ 371 (c)(1),
(2) Date: Feb. 1, 2019

(87) PCT Pub. No.: WO2018/024879
PCT Pub. Date: Feb. 8, 2018

(65) Prior Publication Data
US 2019/0206608 A1 Jul. 4, 2019

(30) Foreign Application Priority Data
Aug. 4, 2016 (DE) .......................... 102016214493.6

(51) Int. Cl.
*H01F 27/28* (2006.01)
*H01F 5/06* (2006.01)
(Continued)

(52) U.S. Cl.
CPC ........... *H01F 27/2823* (2013.01); *B05D 1/62* (2013.01); *C23C 16/458* (2013.01);
(Continued)

(58) Field of Classification Search
USPC ................................ 336/222, 232, 206, 219
See application file for complete search history.

(56) References Cited

U.S. PATENT DOCUMENTS 6,365,012 B1 * 4/2002 Sato ..................... G11B 5/7262
204/192.15
2001/0031563 A1 * 10/2001 Shioya .............. H01L 21/76832
257/E21.252
(Continued)

FOREIGN PATENT DOCUMENTS

CN 1675058 A 9/2005
CN 104105594 A 10/2014
(Continued)

OTHER PUBLICATIONS

German Examination Report, dated Apr. 13, 2017, from priority DE 10 2016 214 493.6, filed on Aug. 4, 2016.
(Continued)

*Primary Examiner* — Shawki S Ismail
*Assistant Examiner* — Kazi S Hossain
(74) *Attorney, Agent, or Firm* — Preti Flaherty Beliveau & Pachios LLP (57) ABSTRACT

The invention relates to a passive electrical component, especially a coil, having an interlayer, wherein the interlayer has a lower coefficient of thermal expansion than the surface of the passive electrical component covered with the inter-
(Continued)

layer, and disposed atop that a plasma-polymeric carbon-containing coating having a carbon content measured at a depth of 80 nm away from the side of the plasma-polymeric coating remote from the interlayer, wherein the plasma-polymeric coating comprises a carbon content of 50 to 100 atom %, preferably 50 to 90 atom %, or is configured as an organometallic coating a carbon content of 2 to 50 atom %, in each case measured by means of XPS.

20 Claims, 4 Drawing Sheets

(51) Int. Cl.
    *H01F 41/12*     (2006.01)
    *B05D 1/00*     (2006.01)
    *C23C 16/458*     (2006.01)
    *C23C 16/509*     (2006.01)
    *H01F 41/04*     (2006.01)

(52) U.S. Cl.
    CPC .............. *C23C 16/509* (2013.01); *H01F 5/06* (2013.01); *H01F 41/04* (2013.01); *H01F 41/12* (2013.01); *B05D 2202/25* (2013.01); *B05D 2350/63* (2013.01)

(56) References Cited

U.S. PATENT DOCUMENTS

| | | | |
|---|---|---|---|
| 2012/0003483 A1 | 1/2012 | Salz et al. | |
| 2016/0163445 A1* | 6/2016 | Bertels | H04R 9/022 |
| | | | 310/156.01 |

FOREIGN PATENT DOCUMENTS

| | | |
|---|---|---|
| CN | 104332564 A | 2/2015 |
| DE | 19608158 C1 | 8/1997 |
| DE | 10131156 A1 | 1/2003 |
| DE | 102004049111 A1 | 4/2006 |
| DE | 10 2011 005 234 A1 | 9/2012 |
| DE | 10 2013 110 394 B4 | 3/2015 |
| DE | 10 2014 224 798 A1 | 6/2016 |
| EP | 1260606 A2 | 11/2002 |

OTHER PUBLICATIONS

International Search Report and Written Opinion, dated Oct. 5, 2017, from counterpart PCT/EP2017/069782, filed on Aug. 4, 2017.
Lommatzsch, U. et al., "Plasma Polymerization of HMDSO with an Atmospheric Pressure Plasma Jet for Corrosion Protection of Aluminum and Low-Adhesion Surfaces," Plasma Processes and Polymers, vol. 6, No. 10, Oct. 14, 2009, pp. 642-648.

* cited by examiner

PASSIVE ELECTRICAL COMPONENT WITH COATING TO IMPROVE THE LOADING CAPACITY

STATEMENT REGARDING FEDERALLY SPONSORED RESEARCH OR DEVELOPMENT n/a

BACKGROUND OF THE INVENTION

The invention relates to a passive electrical component, especially a coil, having an intermediate layer, wherein the intermediate layer has a lower coefficient of thermal expansion than the surface of the electrical component covered with the interlayer, and atop that a plasma-polymeric carbon-containing coating.

The invention further relates to the use of a corresponding plasma-polymeric coating for improving the thermal and/or mechanical durability and/or the media stability of an interlayer on a passive electrical component, especially by the prevention of formation of continuous microcracks. The invention also relates to a process for producing a passive electrical component with an interlayer and a plasma-polymeric coating disposed thereon—both layers preferably have electrically insulating action.

Current trends in the electrical industry are toward ever further reducing the layer thicknesses for electrical insulation layers or coatings. Reasons for this are, as well as the option of more efficient design space utilization, the reduction in heat resistance by virtue of the lower layer thicknesses and the resultant improvement in heating and cooling characteristics. The ingredients of the coating or, in the case of greater layer thicknesses, the sheaths constitute a limitation here in the temperature ranges that are utilizable over long periods. For instance, the standard, often organic-based coatings composed of copper wire enamel or silicone sheaths enable use up to about 200° C. or about 230° C. Brief exceedances (shock) of these maximum values are possible in some cases, but, in the case of prolonged use, lead to usually permanent thermal damage to the insulation material and hence to a significant reduction in the insulation properties and a distinct rise in the risk of failure. Moreover, in the case of conventional enamels, there is the risk of local reduction in layer thickness on heating in combination with mechanical pressure on the electrical component by virtue of the installation situation. This reduction in layer thickness leads, at the sites of occurrence, to a reduction in the insulation capacity and likewise increases the risk of failure.

Additionally disadvantageous in most cases are the necessary thicknesses of the protective coating, which are regularly more than 0.1 mm. This is especially true of thermal heating (poor heat transfer), and also of the maximum possible exploitation of design space. Furthermore, many coating materials only attain the required breakdown resistances to electrical voltages (including safety margin, typical demands under VDE: (use voltage+1000 V)*2) with elevated layer thicknesses.

There follows a brief summary of the most important or most common insulation materials:
sheathing of the wires with silicone (in some cases with glass fiber weave): use usually up to 200° C.—shock up to 230° C., voltage values up to 700 V—peak voltage test up to 2.5 kV (dependence of thickness of the core) with insulation layer thickness about 1.5 mm (3.5 V/µm)

copper wire enamel insulation—basis: polyesterimide— "Wire enamels are solutions of polymers in usually cresolic solvent mixtures. All wire enamels are coated on specific wire enameling machines and baked at 300-600° C. This evaporates and catalytically combusts the solvents. The heat is utilized for heating of the plant. The polymers crosslink and insoluble films are formed. In the soldering of copper enamel wire—even already insulated with a blade or emery paper—small amounts of highly toxic toluene 2,4-diisocyanate can be released; therefore, an exhaust system is required in commercial workplaces. In order to obtain smooth, concentric and pore-free films, enameled wires are typically enameled and baked between 6 and 20 times. The rule of thumb is that the enamel film makes up about 10% of the weight of the copper enamel wire. The resultant rise in diameter is referred to as increase."—source is: https://de.wikipedia.org/wiki/Kupferlackdraht Polyesterimide—see also Kapton (briefly for stresses up to about 400° C., otherwise max. about 250° C.), as well as further variously modified polyimides. The films have a breakdown resistance in the region of 180 V/µm—film thickness is typically ~0.1 mm. But films are unsuitable for many 3-D geometries owing to their relative stiffness and, in the case of high bending radii, owing to limited elongation before cracking.

Fine mica: e.g. K-Therm AS-M 600/800: up to 800° C. briefly and 700° C. for prolonged periods, breakdown resistance about 20 kV/mm (20 V/µm)—disadvantages are large production-related layer thicknesses of 0.5-75 mm—construction produced from silicone resin-impregnated mica paper at high pressure and temperature→They are thus high-temperature compressed laminates with comparatively high layer thickness.

Polyaryl ether ketones (PAEK): "Polyether ketones (PEKs for short) are polymers, in the molecular backbone of which there are alternating ketone and ether functionalities. The most commonly used are polyaryl ether ketones (PAEK) in which there is an aryl group joined in (1,4) positions in each case between the functional groups." They are stable to many chemicals and usable in a long-lasting manner up to about 250° C. and breakdown resistance up to ~20 kV/mm (20 V/µm). However, a high layer thickness is required for adequate insulation values.

Ceramic coatings:
Water-plasma technique for application of ceramic protective layers (thickness 0.1-5 mm): breakdown resistance up to about 3-4 kV/mm (3-4 V/µm) at temperatures up to max. 1400° C. according to the ceramic—but very brittle and difficult to apply to complex geometries, particularly when they are extended for the coating operation (necessary gap accessibility) and then have to be compressed into installation.

Different than coatings—potting compounds:
Means of encapsulation with ceramic-filled potting compounds—in some cases thermally stable up to >1000° C.— relatively good gap accessibility with sufficiently small filler particles—usable in the application of greater layer thicknesses (>100-150 µm).

Ceramic textiles (tube-like coatings):
Polycrystalline metal oxide fibers processed to a weave— filament diameter ~10-12 µm, heat-resistant up to about 1200° C. with breakdown resistances up to 35 kV/mm, usable as woven ply, but with high thicknesses (0.5-1.2 mm) and suitable solely for wrapping—hence of limited utility for 3D geometries.

DE 10131156 A1 describes a polymeric plasma coating having a carbon content of 25 to 50 atom % and specifies, albeit only in very general terms, a possible interlayer between a substrate and the polymeric plasma coating. However, the substrate does not relate to a passive electrical component, and DE 10131156 A1 is silent as to the nature of an allegedly possible interlayer. EP 1260606 A2 describes a material having a low dielectric constant and a CVD method, but likewise does not relate to a passive electrical component.

DE 10 2014 224798 A1 describes the contact unit of an electromagnetic switching device with a dielectric outer layer produced by means of plasma coating methods, which is intended to serve as a component for electromechanical switching devices, especially power switching devices and optionally power switches or residual current circuit breakers, in order especially to provide creep resistance and improve mechanical sliding properties. It is mentioned merely in very general terms that one or more functional layers are conceivable between switching device and outer layer, but without any further details relating to the functional layers.

DE 10 2013 110394 A1 discloses devices having a voltage-resistant, electrically insulating multilayer coating, wherein an interlayer (lower layer) comprising a layer of DLC (diamond-like carbon) or a layer of Al2O3, SiOx, SiN$_x$, Ta$_2$O$_5$, HfO$_2$, TiO$_2$ or ZrO$_2$ is present, and comprises electrical components such as layer capacitors.

There is no description of extensibility of the coating.

DE 19608158 C1 describes a technological background for plasma coatings.

BRIEF SUMMARY OF THE INVENTION

Against the background of the prior art described, it was an object of the present invention to specify a passive electrical component protected by a layer system that overcomes a multitude of the disadvantages described above. More particularly, it was desirable for the layer system to include customary passivations of surfaces of electrical components, to be comparatively inexpensive, to be able to assure good thermal conductivity, still to have good breakdown resistance even at comparatively high temperatures and/or to constitute good protection against mechanical, chemical and/or physical stresses. Moreover, the passive electrical component should preferably be flexible in relation to its layer system, such that certain deformations are possible after application of the layer system without any losses in the desired effects.

This object is achieved by a passive electrical component, especially a coil, having an interlayer, wherein the interlayer has a lower coefficient of thermal expansion than the surface of the electrical component covered with the interlayer, and disposed atop that a plasma-polymeric carbon-containing coating having a carbon content measured at a depth of 80 nm away from the side of the plasma-polymeric coating remote from the interlayer, wherein the plasma-polymeric coating comprises a carbon content of 50 to 100 atom %, preferably 50 to 90 atom %, or is configured as an organometallic coating a carbon content of 2 to 50 atom %, in each case measured by means of XPS and based on the atoms detected by XPS.

In principle, it is known that passive electrical components can be electrically insulated, or protected against a number of influences, with layers having a lower coefficient of thermal expansion than the coated surface. However, owing to the different coefficients of thermal expansion in the event of mechanical and/or thermal stresses, some of the protective effect of the covered layer is frequently lost. Typical examples of such layers are eloxal layers or ceramic layers.

It has been found that, surprisingly, the combination with the plasma-polymeric carbon-containing coating described opens up the option of providing passive electrical components with improved durability than would have been expected via the combination (additive) of the interlayer with the (additional) plasma-polymeric coating.

The production of plasma-polymeric coatings or plasma polymerization per se is known to those skilled in the art. Plasma polymerization is a specific plasma-assisted variant of chemical gas phase deposition (PE-CVD). In plasma polymerization, vaporous organic precursor compounds (precursor monomers) in the process chamber are first activated by a plasma. The activation gives rise to ionized molecules, excited states or free radicals, and molecular fragments of the precursors are formed to some degree in the gas phase. The subsequent condensation of these fragments on the substrate surface then results, under the action of substrate temperature and of electron and ion bombardment, in the polymerization and hence the formation of a continuous layer. The structure of the resultant plasma polymers is highly crosslinked, and they form a largely statistical covalent network. It is therefore not possible to deposit catenated polymers in mono- or polycrystalline form by plasma polymerization. The precursors used are first converted to reactive species under PE-CVD conditions by the excitation in the plasma process. The person skilled in the art therefore distinguishes plasma polymerization from other deposition methods, for example atomic layer deposition (ALD methods). The ALD method is a significantly altered CVD method by means of two or more self-limiting surface reactions conducted in a cyclical manner, as a result of which the layers generally take on a polycrystalline or amorphous structure.

The plasma polymerization used with preference in accordance with the invention is a specific plasma-activated variant of chemical gas phase deposition (PE-CVD), especially as described in detail further down.

Without being bound to a theory, the plasma-polymeric carbon-containing layer appears to be capable of effectively preventing or at least considerably restricting the formation of microcracks in the interlayer, so as to achieve a considerable rise in performance in the event of stresses on the protective effects of the layer system on the passive electrical component.

The carbon content in the plasma-polymeric layer is measured at a depth of 80 nm in order to eliminate surface effects, for example saturation with oxygen. The measurement here is preferably effected as described in measurement example 1.

The component of the invention is a passive electrical component. "Passive component" in this context means that it contains windings and is especially a coil, a capacitor or a resistor. More preferably, the component is a passive electrical power component. A power component is characterized in that it converts one form of energy to another, for example a transformer. Analogously to use in a transformer, further possible fields of use for such a coil are possible, for example, in motors, generators or as an induction coil.

Preferred passive electrical components of the invention are those in which current flows through the surface covered with the interlayer (and of course the corresponding parts of the substrate), or which are intended for current to flow through them.

Particularly preferred passive electrical components in the context of the present invention are a coil, a condenser, a resistor or wire.

Preference is given to a passive electrical component of the invention having an interlayer, wherein the interlayer is selected from the group of the DLC layers, ceramic layers, preferably based on $TiO_2$, $SiO_2$, $Al_2O_3$, $Ti_xN_y$ or BN, further preferably an eloxal layer.

Eloxal layers and ceramic layers are typical insulation layers that are used in the prior art, or protective layers. They have a comparatively low coefficient of thermal expansion, such that, in combination with underlying metals, they frequently lose their protective action under thermal and mechanical stress. In the case of this type of layers, this effect can surprisingly be compensated for or attenuated particularly efficiently by the plasma-polymeric layer for use in accordance with the invention.

A particularly preferred interlayer in the context of the present invention is an eloxal layer, especially in the case of an aluminum surface coated therewith on the passive electrical component. Preferred layer thicknesses of the interlayer are 0.2 to 30 µm, further preferably 1 to 20 µm and particularly 2 to 10 µm.

In addition, it may be preferable in many cases, especially in the case of an eloxal interlayer, that the interlayer is executed such that, in the SEM section, only closed pores are present at least in the upper region toward the plasma-polymeric carbon-containing coating. It may be further preferable that a semicrystalline state exists in the surface region of the eloxal layer. In the case of the eloxal layer, this execution can be achieved, for example, by post-compression in hot water.

Preference is given to a passive electrical component of the invention having an interlayer, wherein the interlayer comprises a crosslinked and/or uncrosslinked oil and/or crosslinked and/or uncrosslinked silicone oil and/or there is a zone of crosslinked oil and/or crosslinked silicone oil between the interlayer and the plasma-polymeric layer.

An oil is understood by the person skilled in the art to mean a collective term derived from the Latin term "oleum" for water-soluble organic compounds that are liquid at 20° C. and have relatively low vapor pressure, the common feature of which is not the corresponding chemical constitution but similar physical consistency. Oils have a relatively high viscosity; they are soluble in virtually all organic solvents. They may be natural, vegetable or animal oils, optionally modified vegetable or animal oils, mineral oils (obtained from mineral oil), and fully synthetic oils, for example silicone oils. The non-silicone oils especially include halogen-free organic liquids selected from the group consisting of hydrocarbons, fatty acids, triglycerides, mineral oils and polyethers.

A silicone oil is understood by the person skilled in the art to mean those synthetic oils in which silicon atoms are joined by oxygen atoms in a chain-like or network-like manner and the remaining valences of the silicon are satisfied by hydrocarbyl radicals, usually methyl groups, and less commonly ethyl groups, propyl groups, phenyl groups inter alia. Alternatively, the remaining valences may also be partly or fully satisfied by halohydrocarbon groups, especially fluorohydrocarbon groups, where all hydrogens are optionally replaced by halogen, especially fluorine atoms. Preferably, corresponding silicone oils have a molecular weight of >600 g/mol.

A crosslinked oil or crosslinked silicone oil is capable of stabilizing the bond between plasma-polymeric layer and interlayer and, for example, of compensating for unevenness on the interlayer or filling pores in the interlayer. At the same time, the crosslinking preferably proceeds in the course of the plasma polymerization process, and this can be adjusted such that crosslinking conditions exist prior to the layer deposition. In the context of the invention, the regions referred to as uncrosslinked still have a low level of crosslinked constituents, which in principle equates to partial crosslinking. Furthermore, the oils/silicone oils tend to be more crosslinked on the open side of the pores of the eloxal layer and, as a result of the degree of crosslinking that exists there, also offer good adhesion to the eloxal material. On the opposite side (closed pore side toward the substrate material), the degree of crosslinking tends to be lower and may also exist in the above-described form of the uncrosslinked oil. As an alternative or in addition to the pore filling, compaction of the interlayer is also possible, for example hot compaction at 90 to 100 degrees Celsius in deionized water for one hour.

Preferably—if pores are still present in the interlayer—these have a size of 1 to 200 nm, preferably 1 to 100 nm and further preferably 1 to 30 nm, based in each case on the greatest pore diameter viewed at right angles to the surface of the interlayer, measured with a scanning electron microscope.

In many cases, however, it is preferable that the pores of the interlayer are filled. Heat-crosslinking silicone, for example, is suitable for this purpose. Very particular preference is given to a material called "HTA" (manufacturer: AZ Electronics Materials GmbH, Wiesbaden). As an alternative or in addition to pore filling, compaction of the interlayer is also possible, for example hot compaction at 90 to 100 degrees Celsius for one hour.

In the context of the invention, preference is given to a passive electrical component having an interlayer, wherein the plasma-polymeric coating comprises silicon.

It has been found that particularly the combination of silicon with carbon-containing plasma-polymeric coatings has a particularly good effect on the protective action of electrical components.

It is preferable that the plasma-polymeric coating for use in accordance with the invention has an average layer thickness of 100 nm to 100 µm, preferably 200 nm to 50 µm and further preferably 500 nm to 10 µm.

It is preferable to deposit the plasma-polymeric layer in such a way as to build up a bias voltage on the substrate. The best way of doing this is by connecting the substrate to be coated at the cathode. This results in ion bombardment of the resultant coating, so as to form—without being bound to a theory—layers having a good combination of the properties of hardness and flexibility, expressed by extension before cracking of ≥2.5%, preferably ≥3%.

Such flexibility is especially important for passive electrical components which, after they have been coated, have to be formed once again, as may be the case, for example, in the case of coils after the coating process.

Particularly good layer properties are achieved here in the case of establishment of bias voltages of 50 to 300 volts, preferably 100 to 200 volts, during the deposition process versus ground (of the plasma generator).

It is preferable that the plasma-polymeric coating has a hardness to be measured by means of nanoindentation in the range from 1.5 to 6 GPa, preferably 2.4 to 5 GPa, further preferably 3.1 to 4 GPa.

This nanoindentation hardness is more preferably in combination with an extension before cracking of ≥2.5% and further preferably in a combination with an extension before cracking of ≥3.0%. Thus, layers having a particularly good combination of hardness and flexibility are present on the passive electrical component.

In the context of the invention, preference is given to a passive electrical component having an interlayer, wherein the surface of the component covered by the interlayer consists of copper, aluminum or an alloy comprising copper and/or aluminum.

Such surfaces can be protected particularly efficiently by the layer system for use in accordance with the invention.

It is preferable that a passive electrical component of the invention, especially the interlayer, prior to the coating with the plasma-polymeric layer for use in accordance with the invention, has a roughness value $R_A \leq 4$ µm, preferably $R_A \leq 2$ µm and further preferably $R_A \leq 1$ µm. The $R_A$ is measured to DIN EN ISO 4288: 1998-04.

For this purpose, it may be preferable, during the production of a coil of the invention, i.e. prior to the coating with the plasma-polymeric layer, for there to be a cleaning or smoothing of the surface of the interlayer. This can firstly be accomplished by already above-described filling of the pores of the interlayer or compaction of the interlayer. Alternative methods are cleaning in a cleaning bath (for example by means of ultrasound, preferably using a detergent), plasma polishing, electrolytic polishing and/or further cleaning methods suitable for the respective interlayer surface.

It may of course be preferable also to pretreat the corresponding surface of the substrate (of the passive electrical component) in such a way that smoothing takes place.

Preference is given to a passive electrical component of the invention with an interlayer, wherein the plasma-polymeric coating, by measurement by means of XPS measured at a depth of 80 nm away from the side of the plasma-polymeric coating remote from the interlayer, comprises, preferably consists of, from 5 to 40 atom %, preferably 20 to 32 atom %, of silicon and/or 30 to 70 atom %, preferably 40 to 64 atom %, of oxygen, based on the total number of the carbon, silicon and oxygen atoms present in the coating.

The layers of the preferably atomic composition have been found to be particularly suitable for the invention.

Preference is given to a passive electrical component of the invention with an interlayer, wherein the plasma-polymeric layer has a deviation of −60% to +1000%, preferably −50% to +500%, further preferably −55% to +250%, based on the average layer thickness, in individual regions of the layer.

It is possible by means of the coating process that, for example, in the case of coating of an aluminum coil provided with an eloxal interlayer, the coating process is conducted such that there is a particularly low layer thickness of the plasma-polymeric layer in the middle of the coil, whereas the average layer thickness is present on the outside, whereas an elevated layer thickness exists on the inside. The inside is the side of the coil that faces the tooth of the motor or laminated core. The outside is accordingly the opposite side, and the middle the position in between.

Preference is given to a passive electrical component of the invention having an interlayer for use in accordance with the invention, wherein the interlayer and the plasma-polymeric layer together have a breakdown resistance measured according to DIN EN 60243-1 and DIN EN 60243-2 of ≥100 V, measured for a current for a maximum of 3 mA.

Breakdown resistance is an important index for passive electrical components, especially for coils, capacitors and resistors. It has been found here that, with decreasing roughness of the plasma-polymeric-coated surface, with otherwise identical parameters (layer thickness, deposition conditions etc.), there is an increase in electrical breakdown resistance.

It was also found in a preferable manner that, when the above-identified roughness values of the substrate are exceeded, the layer thickness of the plasma polymer layer has to be increased by a factor between 2 and 10 in order to be able to achieve the same electrical insulation properties and values.

Preference is given to a passive electrical component of the invention having an interlayer, wherein the component after aging at 300° C. for 500 hours in an air circulation oven with dry circulating air followed by cooling to 20° C. within one hour has at least 80% of the breakdown resistance prior to the aging.

In the coating system for use in accordance with the invention on the passive electrical component, it is possible to achieve surprisingly good and long-lasting values for breakdown resistance. Breakdown resistance is preferably as described in measurement example 2.

It has been found here that it is also possible to repair components of the invention that have been plasma polymer-coated by another corresponding coating operation in cases where the components do not (any longer) fulfill the minimum demands. It is even possible to restore components that do not meet or no longer meet the demands on breakdown resistance, for example, by a (post-)coating operation with a plasma-polymeric layer for use in accordance with the invention, even when these did not previously have such a layer.

This coating operation in fact gives rise to a passive electrical component of the invention, and the restoration and/or improvement of properties such as breakdown resistance is a surprising effect that can be achieved by means of the plasma-polymeric coating, especially in the above-described preferred variants.

Preference is given to a passive electrical component of the invention having an interlayer, wherein the electronic component does not have any visually detectable etch attack in the region of the plasma-polymeric layer on exposure to a 1 mol/L NaOH solution for a duration of 20 minutes at room temperature.

The testing for stability to NaOH solution is described in measurement example 3.

The layer system for use in accordance with the invention, composed of interlayer and plasma-polymeric outer layer, makes it possible not just to electrically insulate passive electrical components but likewise to protect them against corrosion attacks or etch attacks by alkalis in the case of appropriate configuration.

Part of the invention is the use of a plasma-polymeric coating as described above, preferably in one of the preferred variants, for improvement of thermal and/or mechanical durability and/or media stability of an interlayer on a passive electrical component, in each case as defined above, especially by prevention of the formation of continuous microcracks.

"Media" stability is understood in the context of the present application especially to mean stability to oxidizing substances, especially oxygen and water and/or to acids and bases, especially to bases. In the case of doubt, "media stability" should be determined as stability to 1M NaOH solution. As already described above, it is a core of the present invention that the combination of the interlayer which is prone to cracks with respect to the substrate with the plasma-polymeric layer can achieve a distinct improvement in the protection properties of the interlayer.

Also part of the invention is the use of a plasma-polymeric coating as described above for restoration of the insulating effect of an interlayer as described above on a passive electrical component, especially both for the interlayer and for the passive electrical component in one of the preferred variants.

It is thus possible to restore damaged passive electrical components or fundamentally prepare them for use.

Also part of the invention is a process for producing a passive electrical component having an interlayer and plasma-polymeric coating disposed thereon, comprising the steps of:

a) providing a passive electrical component as described above,
b) disposing an interlayer as described above on the substrate, preferably by means of a wet-chemical process,
c) depositing a plasma-polymeric coating as described above atop the interlayer.

By means of the process of the invention, it is possible to produce passive electrical components with the positive properties described above.

Preference is given to a process of the invention wherein step c) is conducted in a high-frequency plasma polymerization reactor under low pressure and the substrate is connected as the cathode.

The connection of the substrate as the cathode—as already described above—brings about acceleration of ions to the plasma-polymeric coating. This makes it possible that the impact of the ions internally regroups or alters the layer such that it produces the surprising good layer properties in combination with the interlayer for use in accordance with the invention.

The plasma-polymeric coating can generally be produced either from organosilicon precursors (preferably HMDSO) or from purely organic precursors (preferably acetylene). In this case, it is possible either to use a precursor to generate an inorganic skeleton (preferably silicon-based) of the plasma polymer or purely organic precursors with adapted network formation (in the direction of DLC layers).

The necessary layer thicknesses of the configurations should be adapted essentially to the mechanical stability or the demands on breakdown resistance. What should additionally be taken into account here are sufficient tolerances in order, for example, to counter existing surface defects in the material to be coated. Advantageously, this can be effected very easily via the choice of layer thickness.

Figure 1:
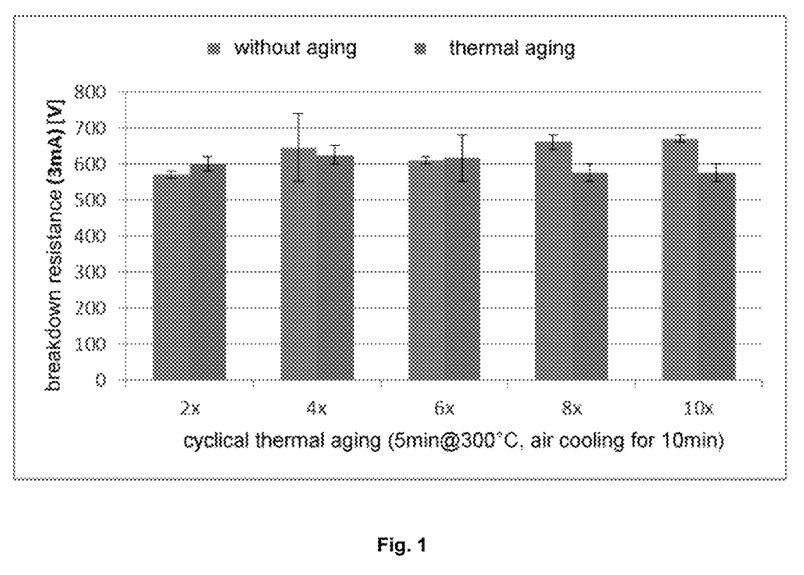
FIG. 1 shows the results of cyclical aging operations at high temperatures (5 min at 300° C.) with subsequent cooling under air for 10 minutes in each case. The coating used was the layer from working example 1 on aluminum coil. The measurements were each conducted with a coil before and after aging (left-hand and right-hand bars). The reason for any deviation in the starting value of the coils for the respective pairs of measurements is that different coils were used.
Figure 2:
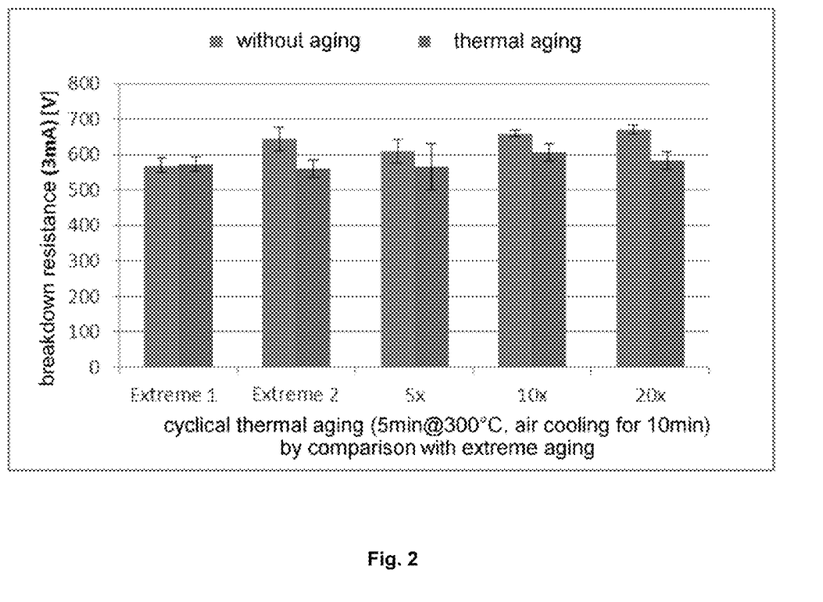
FIG. 2 shows the result of a 5-fold cyclical aging operation for 24 hours at 180° C. and directly thereafter cooling to −20° C. and contact with air for one hour with reheating to 180° C. for one hour and cooling thereafter to room temperature on contact with air (Extreme 1 and Extreme 2) by comparison with cyclical aging as above (5 minutes at 300° C., air cooling for 10 minutes) for 5, 10 and 20 cycles (5×, 10× and 20×). The left-hand column here in each case is the value before the respective aging sequence, and the value in the right-hand column that after the aging described in each case.

The layers to be used in accordance with the invention on passive electrical components preferably raise the upper temperature limit for use successfully to ≥300° C. An experimental example of this is given by the data that underlie FIG. 1:

BRIEF DESCRIPTION OF THE SEVERAL VIEWS OF THE DRAWINGS

The layer thicknesses were in each case about 5 μm.

The breakdown resistances here are dependent on the layer combination applied and on the layer thicknesses of the layer constituents and can be brought to above 2 kV (layer thickness about 60 μm~33 V/μm). Cyclical heating to ~180° C. for 10 min including direct cooling on a metal block (the starting temperature was room temperature) for 5 min. did not show any significant decline in breakdown resistance.

"Extreme" aging of the coils coated as described above likewise showed a similar effect.

DETAILED DESCRIPTION OF THE INVENTION

Figure 4:
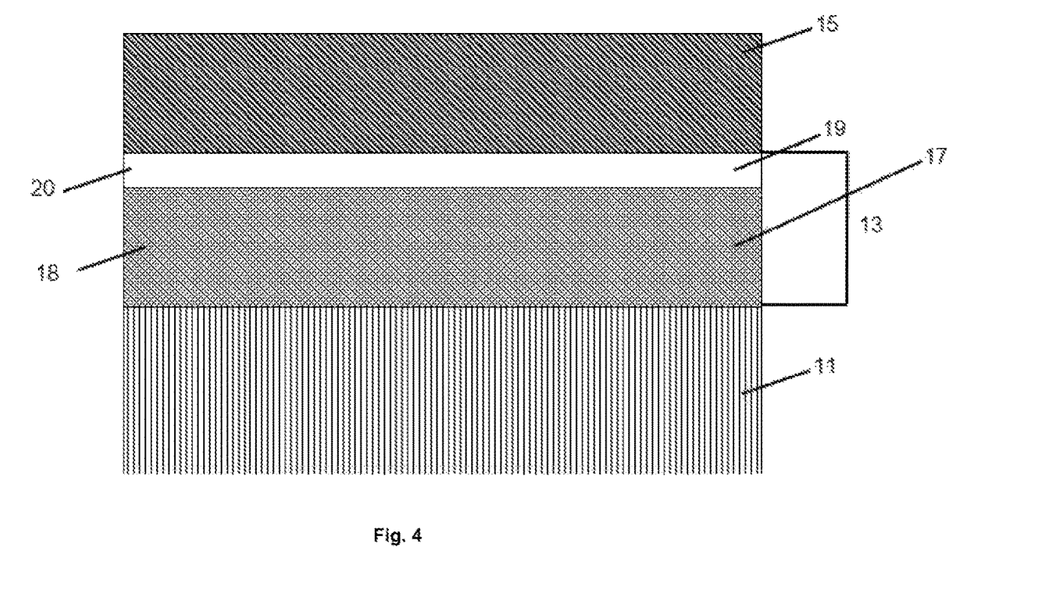
FIG. 4 shows a passive electrical component comprising an interlayer covering surface of the passive electrical component and a plasma-polymeric coating disposed on top of the interlayer, according to a non-limiting embodiment of the invention.

In a non-limiting embodiment, the invention features a passive electrical component 11 including an interlayer 13 covering a surface of the passive electrical component 11 and a plasma-polymeric coating 15 disposed on top of the interlayer, as shown in FIG. 4. In a non-limiting embodiment, the interlayer 13 includes a ceramic layer 17. In another non-limiting embodiment, the ceramic layer 17 includes an epoxal layer 18. In yet another non-limiting embodiment, the interlayer 13 includes a zone of crosslinked oil 19 present between the interlayer and the plasma-polymeric coating. In still another non-limiting embodiment, the zone of crosslinked oil 19 includes a zone of crosslinked silicone oil 20 between the interlayer and the plasma-polymeric coating.

EXAMPLES

Measurement Examples

Measurement Example 1

Performance of the XPS Measurement at Layer Depth 80 nm

Surface analysis by means of photoelectron spectroscopy (XPS) covers the outermost about 10 nm of a solid-state surface. In order to be able to analyze the chemical composition of the sample material at a depth of 80 nm by XPS, the surface is removed by ion beam bombardment. For this atomization process, argon ions with an energy of 3 keV are typically used. The duration required to remove the uppermost 80 nm of a sample surface depends on the instrument-specific atomization rate. This is determined experimentally in each case by comparative measurements on corresponding reference samples. The typical pressure range for sputtering processes of this kind is in the range from $1*10^{-5}$ to $1*10^{-6}$ mbar.

Measurement Example 2

Testing of Electrical Insulation Properties:
Partial Discharge Measurement Technique:
→Nondestructive test method for determination of the electrical insulating effect of coatings (by way of example for the DWX-05 instrument, preferably on coil geometries or electric motors)
Technique:

The instrument used (DWX-05) is essentially a high-voltage source capable of generating a high-voltage pulse within a very short time (shorter than 1 msec—with a large flank) or of "imprinting" it into the component. This involves connecting the component to be examined (preferably a coil or a motor part) firstly to the voltage source and secondly to the measurement electronics. In addition, an RF antenna (including band filter) which is connected to the instrument measures the occurrence of RF discharges (correlated in time) with the imprinted voltage pulse. What is important here is that the antenna and the coil are not in conductive contact with one another. The measurement starts from a preset voltage and the voltage is increased continuously to a particular value until a TE discharge is detected or the required end voltage is attained. The measurement used is firstly the response of the system (the coil) itself (case A) and secondly the detection of RF discharges (case B), which are characteristic and are observed shortly before the occurrence of a breakdown between two windings or to the tooth. The measurements are conducted at least 3 times for each voltage value and the final values are used to ascertain an average in order to obtain a statistically assured result. In the case of large variations in the final measurement values, the sample should, if necessary, be checked for homogeneity or the measurement ascertained should be used only with restrictions.

The deviations in the measurement signals from the target state that were allowed beforehand thus effectively form the test criteria. Maximum possible voltage values in the present instrument are 5 kV.

For this test method, the measurement signals are analyzed in two ways (if necessary both criteria at the same time):
1. comparison with a reference signal (recorded on an undamaged component or in a lower voltage range in which the insulation is definitely intact—assessment on the basis of the curve profile)—deviations of more than +20% or −4% of the detected response signal from the scaled curve of the reference signal are regarded as "defective" insulation for the voltage value being tested in each case or a collapse in the response signal (by short-circuit)
→together case (A)
2. measurement of RF discharge and comparison with the "base noise" of the RF signal—in the event of deviations or the occurrence of distinct RF signals (correlated in time with the voltage progression of the imprinted signal), a partial discharge is detected and hence the coating is considered to be inadequate over and above this voltage value—it is additionally advisable to use the LaPlace 15/0 criterion in the automated evaluation.
→together case (B)

Requirement on Samples:
Geometry in the form of a coil (metal substrate)
Minimum demand on inductivity—currently at least 10 windings, instrument-specific value
Full-area coating in uniform quality on a component or the individual components together in a "batch check"
Accessibility of the contacting and of the tooth (in the installed state) or regions of tooth and coil that can come into contact without coating.
→Testing for 100% of the components possible by this test method in a manner suitable for mass production Further information on this test method can be found in: Ein neues Verfahren zur automatischen Gewinnung der Teilentladungseinsetz-und Aussetzspannung an elektrischen Wicklungen nach IEC TS 60034-18-41 und IEC TS 61934 [A New Method of Automatically Obtaining the Partial Discharge Inception and Extinction Voltage of Electrical Windings According to IEC TS 60034-18-41 and IEC TS 61934]—from conference: Internationaler ETG-Kongress 2009-Symposium 3: Direktantriebe in Produktionsmaschinen und Industrieanlagen-Generatoren und Antriebe in regenerativen Kraftwerken [Direct Drives in Production Machines and Industrial Plants—Generators and Drives in Renewable Power Plants]/Symposium 4: Diagnostik elektrischer Betriebsmittel [Diagnostics of Electrical Equipment] Oct. 27, 2009-Oct. 28, 2009 at Dusseldorf, Germany.

Measurement Example 3

Procedure for Testing for Stability to Sodium Hydroxide Solution (Media Stability)

The testing for stability to sodium hydroxide solution for preferred configuration variants of the invention is conducted as follows:

The coating executed in accordance with the invention is contacted with 1 mol/L NaOH solution at room temperature for a duration of 20 minutes. This can be accomplished by applying a droplet of the sodium hydroxide solution to the surface. Subsequently, the sodium hydroxide solution is removed and cleaned such that no residues remain on the surface to be tested. Finally, a visual examination is made, i.e. with the naked eye (without optical aids) as to whether an etch attack has taken place. If the surface examined is unchanged, it has passed the stress test.

Measurement Example 4

Stress Test for Breakdown Resistance

Coils/samples were produced as in working example 1. An oven was heated to 300° C. and the coils were placed therein and stored therein for 500 h. After the aging, the samples were removed and cooled to room temperature within one hour. Thereafter, the samples were tested according to measurement example 2. A maximum drop in the breakdown resistance by 15% was observed by comparison with the starting state prior to the aging. A variant according to working example 2 achieves similar values to the variant according to working example 1 that has been described here.

Measurement Example 5

Nanoindentation Measurement

Nanoindentation is a testing technique by which the hardness of surface coatings can be ascertained by means of a fine diamond tip (triangular pyramids [geometry according to Berkovich], radius a few hundred nm). In this case, by contrast with the macroscopic determination of hardness (for example Vickers hardness), the measurement is not made on the remaining indentation trough that has been made by a normal force, and instead a penetration depth-dependent cross-sectional area of the nanoindenter has been assumed. This depth-dependent cross-sectional area is ascertained via a reference sample with known hardness (generally high-purity quartz glass).

During the application of the normal force, nanoindentation uses sensitive steering electronics (capacitative plates) by which the penetration depth can be measured precisely as the normal force rises and falls again—quite differently to the conventional method. During the initial phase of load removal in situ, the standard force penetration depth curve indicates the stiffness of the sample. With the aid of the cross-sectional area of the nanoindenter which is known from the reference sample, the modulus of elasticity and hardness of the sample can be determined. The maximum testing force for the nanoindentation is generally below 15 mN.

For measurement of the pure properties of the coating without any influence by the substrate, a rule of thumb of 10% of the layer thickness is used. Penetration curves that go below that include an influence by the substrate used. With rising penetration depths of more than 10% of the layer thickness, the measured values for modulus of elasticity and hardness successively approach those of the substrate. The described evaluation by this test method is named for Oliver & Pharr [Oliver].

For simpler variation of the penetration depths at different loads, what is called the multiple loading and load relief method, the multiindentation method for short, is used. In this case, loads are applied and relieved on a fixed point in segments. The local load maxima are increased continuously. At the fixed point, it is thus possible to ascertain depth-dependent values of modulus of elasticity and hardness. In addition, for statistical purposes, various unaffected sites on the sample are likewise approached and tested in a measurement field. By comparison between single indentation and multiindentation methods, Schiffmann & Mister showed that there are only very small deviations between the values ascertained in the two methods [Schiffmann]. For compensation, longer hold times are suggested for prevention of creep effects of the piezo scanner [Schiffmann].

In the case of the measured samples of the working examples described in the text, measurement was made with 10 multiindentations per site with preferably a maximum of 5 mN, further preferably less than 2 mN, even further preferably less than 1 mN. The multiindentations have local force maxima that have then been reduced to 20% of the force. These load relief curves were evaluated in the form of a tangent from 98% to 40%.

For statistics and homogeneity, 10 measurement points per sample were tested. The distance between the measurement points was 50 µm in order to avoid effects such as plastic deformations of the layer to be examined as a result of prior measurements, for example.

The layer thicknesses of the samples that were used to determine the layer hardnesses were more than 1 µm in each case. To comply with the empirical formula for the penetration depth of max. 10% of the layer thickness, the load relief curves for the multi-indentations are admissible for the evaluation up to a maximum force of not more than 5 mN, further preferably less than 2 mN, even further preferably less than 1 mN. In the case of lower layer thicknesses, the corresponding maximum local force should be noted in order not to exceed the 10% rule.

The maximum force for the penetration depth and the corresponding load relief curves is thus preferably not more than 5 mN, further preferably less than 2 mN; depending on the layer thickness of about 1000 nm it is even further preferably less than 1 mN.

Equipment Used:

For the nanoindentations of the example (working examples, example 1), a Universal Material Tester (UMT) with Nano-Head nanoindentation module (NH2) from CETR (now part of Bruker AXS S.A.S.) with corresponding vibration damping technique (minus k) was used in a thermal and acoustic insulation chamber.

References for the Description of the Standard Teaching:

[Oliver]: W. C. Oliver et al., J. Mater. Res. Vol. 7, No. 6. (1992), 1564

[Schiffmann]: K. I. Schiffmann et al., Z. Metallkunde 95, No. 5 (2004), 311

WORKING EXAMPLES

Example 1

Low-Pressure Plasma Coating Process

The deposited plasma layers based on an inorganic matrix structure (preferably silicon-based) have a comparatively high organic character which, by comparison with SiOx layers, results in a higher crack onset strain. The plasma layers are preferably deposited under reduced pressure at about $10^{-2}$ mbar with the aid of a high-frequency plasma discharge (PE-CVD). In this case, a silicon-containing working gas is fragmented. The resultant fragments precipitate on the substrate as a thin layer. In order to increase the density of the layer, an ion-assisted method is employed, meaning that the partly ionized fragments are fired into the growing layer under the influence of an electrical field. The use of this technology ensures the applicability of the coating to complex coil geometry.

Low-Pressure Plasma Coating Process

The plasma coating is conducted under reduced pressure with a reactor of size 360 L at about $10^{-2}$ mbar. An aluminum coil with 14 windings is extended to a length of 18 cm and placed onto two coupled sheets (200 mm×25 mm×1 mm). These sheets lie on an insulator plate (0.2 mm) which in turn lies on the actual plasma electrode. This construction prevents arcing that occurs during the plasma coating. The capacity of the coupled sheets is about 68 pF in each case. The frequency of the high frequency used of 13.56 MHz results in a resistance per coupled sheet of 171 ohms.

At the start of the coating process, plasma activation with oxygen is conducted for 3 minutes. This step leads to an improvement in layer adhesion.

In the second step, a primer layer is deposited. For this purpose, for oxygen, a flow rate of 5 sccm of hexamethyldisiloxane (HMDSO) is admitted into the reactor. The process time is 1 minute. The actual deposition process of the insulation coating is conducted at a HMDSO flow rate of 20 sccm. The process time is 2 hours. In order to hydrophilize the surface of the coated coil, it is subsequently possible to conduct a further plasma activation with oxygen.

The plasma power and oxygen flow rate in all process steps are constant and are 45 W and 60 sccm respectively.

The coated coil was characterized with regard to layer thickness and insulating effect. This resulted in the following values:

TABLE 1

| Area of winding (layer thickness about 4.5 μm) | Outer edge (layer thickness about 7.0 μm) | Inner edge (layer thickness about 11 μm) |
|---|---|---|
| 470 V | 610 V | 640 V |
| 470 V | 540 V | 720 V |
| 450 V | 620 V | 670 V |
| Ø 463.3 V | Ø 590.0 V | Ø 676.7 V |

Alternatively, the coating process by means of plasma can also be assisted by the application of what is called a BIAS voltage. Advantages here are the possibility of increasing the layer deposition rate and the possibility of generating a denser plasma polymer matrix.

Example 2

Treatment Process of Anodization+ND Plasma Coating

Al sheets/Al coils are wet-chemically cleaned, pickled and anodized in a sulfuric acid-based electrolyte for 5-60 min. The subsequent treatment of a hot compaction at 90° C. to 100° C. for 10 to 60 minutes is optional. The anodization layers thus produced on the aluminum coils have a layer thickness of 1 μm to 25 μm. Subsequent coating treatment by the scheme of example 1.

Example 3

Treatment Process of Anodization+Filling of the Pores of the Anodization Layer+ND Plasma Coating Al sheets are wet-chemically cleaned, pickled and anodized in a sulfuric acid-based electrolyte for 10 to 60 min. No hot compaction takes place. The sheets are subsequently aged in a US bath with HTA oil (5, 15, 30 min). There is a final heat treatment for crosslinking of the oil (7 d at RT or 30 min at 100° C.). Subsequent coating treatment by the scheme of example 1.

As a result, it is possible to increase breakdown resistance by up to 20% by comparison with example 2.

Example 4

Aging

Figure 3:
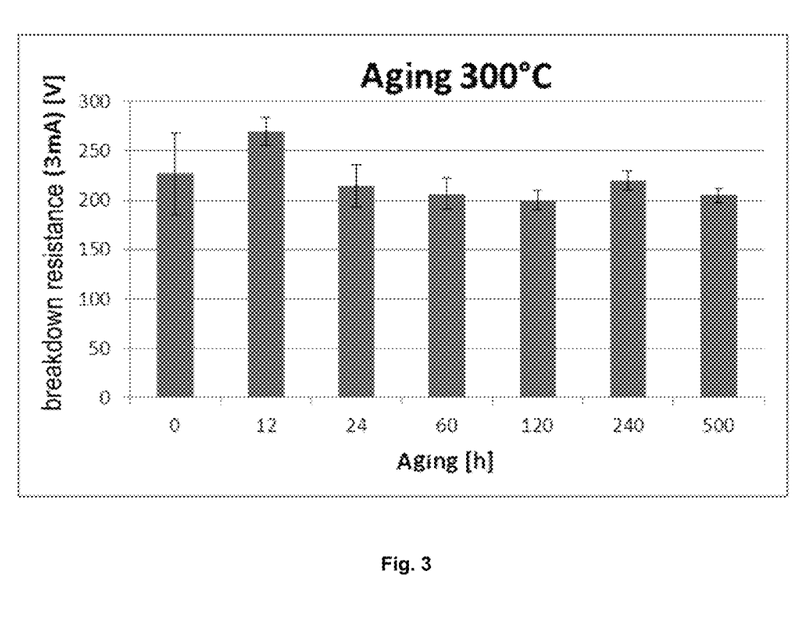
FIG. 3 shows the results of breakdown resistance versus aging operations of 0 to 500 hours at 300° C.

Execution of the coating of the coils as in example 1—the subsequent aging as in measurement example 4. The results are depicted in FIG. 3.

What is claimed is:

1. A passive electrical component comprising:
   an interlayer covering a surface of the passive electrical component;
   wherein the interlayer has a coefficient of thermal expansion which is lower than a coefficient of thermal expansion of the surface of the electrical component covered by the interlayer; and
   a plasma-polymeric coating disposed on top of the interlayer and having a carbon content measured at a depth of 80 nm away from a side of the plasma-polymeric coating remote from the interlayer;
   wherein the plasma-polymeric coating comprises at least one of the carbon content being in a range of 50 to 100 atom % and an organometallic coating having a carbon content being in a range of 2 to 50 atom %,
   wherein the carbon content is measured by means of XPS and based on atoms detected by XPS.

2. The passive electrical component according to claim 1, wherein the interlayer comprises a ceramic layer.

3. The passive electrical component according to claim 1, wherein the interlayer comprises at least one of a crosslinked oil, an uncrosslinked oil, a crosslinked silicone oil, an uncrosslinked silicone oil, a zone of crosslinked oil present between the interlayer and the plasma-polymeric coating, and a zone of crosslinked silicone oil present between the interlayer and the plasma-polymeric coating.

4. The passive electrical component according to claim 1, wherein the plasma-polymeric coating comprises silicon.

5. The passive electrical component according to claim 1, wherein the surface of the passive electrical component covered by the interlayer comprises a material selected from the group consisting of a copper, an aluminum, an alloy comprising a copper, an alloy comprising an aluminum, and an alloy comprising a copper and an aluminum.

6. The passive electrical component according to claim 1, wherein the plasma-polymeric coating has at least one of:
   an extension before cracking of ≥2.5%, and
   a hardness measured by means of nanoindentation in the range from 2 to 6 GPa.

7. The passive electrical component according to claim 1, wherein the plasma-polymeric coating comprises a proportion, determinable by measurement by means of XPS measured at a depth of 80 nm away from the side of the plasma-polymeric coating remote from the interlayer, of at least one of
   5 to 40 atom % of silicon, and
   30 to 70 atom % of oxygen; and
   wherein the proportion is based on a total number of carbon, silicon and oxygen atoms present in the plasma-polymeric coating.

8. The passive electrical component according to claim 1, wherein the plasma-polymeric coating has a thickness in a range of 100 nm to 100 μm.

9. The passive electrical component according to claim 1, wherein the interlayer and the plasma-polymeric layer together have a breakdown resistance measured according to DIN EN 60243-1 and DIN EN 60243-2 testing methods of ≥100 V measured up to a maximum current flow of 3 mA.

10. The passive electrical component according to claim 1, wherein the passive electrical component after aging at 300° C. for 500 hours in an air circulation oven under dry circulating air followed by cooling to 20° C. within one hour has a post-aging and cooling resistance of at least 80% of a breakdown resistance prior to aging.

11. The passive electrical component according to claim 1, wherein the passive electrical component does not have a visually detectable etch attack in a region of the plasma-polymeric layer after the region is exposed to a 1 mol/L NaOH solution for a duration of 20 minutes at room temperature.

12. A process for producing the passive electrical component according to claim 1, comprising the steps of:
   a) providing a substrate of the passive electrical component;
   b) disposing the interlayer on the substrate thereby covering the surface of the passive electrical component; and
   c) depositing the plasma-polymeric coating on top of the interlayer.

13. The process according to claim 12, wherein step c) is conducted in a high-frequency plasma polymerization reactor under low pressure and the substrate is connected as the cathode.

14. The process according to claim 12, wherein step c) is conducted via a wet chemical process.

15. The passive electrical component according to claim 2, wherein the ceramic layer is selected from the group of ceramic layers consisting of $TiO_2$, $SiO_2$, $Al_2O_3$, $Ti_xN_y$ or BN.

16. The passive electrical component according to claim 2, wherein the ceramic layer further comprises an eloxal layer.

17. The passive electrical component according to claim 6, wherein the hardness is in a range of 2.4 to 5 GPa.

18. The passive electrical component according to claim 7, wherein the plasma-polymeric coating comprises the proportion of at least one of:
   20 to 32 atom % of silicon, and
   40 to 64 atom % of oxygen.

19. The passive electrical component according to claim 1, wherein the plasma-polymeric coating has a thickness in a range of 200 nm to 50 μm.

20. The passive electrical component according to claim 1, wherein the plasma-polymeric coating has a thickness in a range of 500 nm to 10 μm.

* * * * *

UNITED STATES PATENT AND TRADEMARK OFFICE
CERTIFICATE OF CORRECTION

PATENT NO. : 11,646,148 B2  
APPLICATION NO. : 16/322838  
DATED : May 9, 2023  
INVENTOR(S) : Dirk Salz et al.

Page 1 of 1

It is certified that error appears in the above-identified patent and that said Letters Patent is hereby corrected as shown below:

On the Title Page

Delete:
"(73) Assignee: Fraunhofer-Gesellschaft zur Förderung dee angewandten Forschung e.V., Munich (DE)"
Insert:
--(73) Assignee: Fraunhofer-Gesellschaft zur Förderung der angewandten Forschung e.V., Munich (DE)--

Signed and Sealed this  
Sixteenth Day of January, 2024

Katherine Kelly Vidal  
*Director of the United States Patent and Trademark Office*